(12) United States Patent
Lapham (10) Patent No.: US 10,821,846 B2
(45) Date of Patent: Nov. 3, 2020

(54) WIRELESS EQUIPMENT CONCEALMENT SYSTEM UTILIZING AN AERIAL MULTIMEDIA PLATFORM

(71) Applicant: SmartCiti Solutions, Inc., Wilmington, DE (US)

(72) Inventor: James Troy Lapham, Pioneer, CA (US)

(73) Assignee: SmartCiti Solutions, Inc., Wilmington, DE (US)

( * ) Notice: Subject to any disclaimer, the term of this patent is extended or adjusted under 35 U.S.C. 154(b) by 148 days.

(21) Appl. No.: 16/436,705

(22) Filed: Jun. 10, 2019

(65) Prior Publication Data

US 2019/0364679 A1    Nov. 28, 2019

Related U.S. Application Data

(63) Continuation of application No. 15/583,964, filed on May 1, 2017, now Pat. No. 10,321,591, which is a
(Continued)

(51) Int. Cl.
*H05K 5/02* (2006.01)
*H01Q 1/12* (2006.01)
(Continued)

(52) U.S. Cl.
CPC .............. *B60L 53/14* (2019.02); *F21V 21/116* (2013.01); *H01Q 1/1242* (2013.01); *H01Q 1/44* (2013.01);
(Continued)

(58) Field of Classification Search
CPC ... B60L 11/1816; F21V 21/116; H02J 7/0042; H02S 20/20; H04W 88/08; H05K 5/0213;
(Continued)

(56) References Cited

U.S. PATENT DOCUMENTS

2,211,858 A * 8/1940 Martin .................... H01Q 1/103
343/889
2,415,103 A * 2/1947 Langstroth ............... H01Q 3/08
343/761
(Continued)

*Primary Examiner* — Timothy J Thompson
*Assistant Examiner* — Rhadames Alonzo Miller
(74) *Attorney, Agent, or Firm* — Armstrong Teasdale LLP; Edward F. Behm, Jr.

(57) ABSTRACT

A wireless communication casing is an apparatus that conceals wireless communication equipment while maintaining the signal communication between wireless communication equipment and corresponding wireless communication devices. The apparatus includes an upper capsule, a lower shroud, a tubular housing, a stopper, a mounting pole, a support post, and a pulley assembly. The upper capsule covers the tubular housing which surrounds the mounting pole. The lower shroud upholds and encloses the tubular housing. The stopper upholds the mounting pole above the support post. The mounting pole serves as a platform to mount wireless communication equipment. The support post elevates the mounting pole and consequently the wireless communication equipment above the ground. The pulley assembly raises and lowers the tubular housing and the lower shroud along the support post. The pulley assembly facilitates the accessibility of the wireless communication equipment.

19 Claims, 12 Drawing Sheets

Related U.S. Application Data continuation-in-part of application No. PCT/US2014/066421, filed on Nov. 19, 2014.

(60) Provisional application No. 62/072,303, filed on Oct. 29, 2014.

(51) Int. Cl.

| | |
|---|---|
| H01Q 1/44 | (2006.01) |
| B60L 53/14 | (2019.01) |
| H02S 20/20 | (2014.01) |
| F21V 21/116 | (2006.01) |
| H02J 7/00 | (2006.01) |
| H02S 99/00 | (2014.01) |
| H04W 88/08 | (2009.01) |

(52) U.S. Cl.
CPC ............ *H02J 7/0042* (2013.01); *H02S 20/20* (2014.12); *H02S 99/00* (2013.01); *H04W 88/08* (2013.01); *H05K 5/0213* (2013.01); *H05K 5/0217* (2013.01)

(58) Field of Classification Search
CPC ...... H05K 5/0217; H01Q 1/1242; H01Q 1/44; H01Q 1/103; H01Q 1/08
See application file for complete search history.

(56) References Cited

U.S. PATENT DOCUMENTS

| | | | | |
|---|---|---|---|---|
| 2,514,670 A * | 7/1950 | Rabinowicz | ............ | H04B 1/08 455/170.1 |
| 2,583,210 A * | 1/1952 | Edwards | ................. | H01Q 3/04 343/760 |
| 2,590,484 A * | 3/1952 | Youhouse | .............. | H01Q 1/103 52/121 |
| 2,639,381 A * | 5/1953 | Thompson | ............... | H01Q 1/08 248/219.1 |
| 2,695,957 A * | 11/1954 | Cone | ...................... | H01Q 1/103 74/501.6 |
| 2,781,668 A * | 2/1957 | Berta | ..................... | H01Q 1/103 476/61 |
| 2,838,953 A * | 6/1958 | Cone | ...................... | H01Q 1/103 74/500.5 |
| 2,870,973 A * | 1/1959 | Carlson | ................. | H01Q 1/103 242/390.3 |
| 2,961,657 A * | 11/1960 | Hodges | .................... | H01Q 9/30 343/714 |
| 2,989,259 A * | 6/1961 | Youhouse | .............. | H01Q 1/103 242/390.3 |
| 3,016,206 A * | 1/1962 | Cone | ...................... | H01Q 1/103 242/390.3 |
| 4,041,498 A * | 8/1977 | Freimark | ................. | H01Q 1/10 343/749 |
| 4,542,383 A * | 9/1985 | Cusey | .................... | H01Q 1/103 343/903 |
| 4,591,868 A * | 5/1986 | Cusey | .................... | H01Q 1/103 318/467 |
| 4,607,389 A * | 8/1986 | Halgrimson | ........... | G05D 3/105 455/11.1 |
| 4,665,406 A * | 5/1987 | Takizawa | ............... | H01Q 1/103 343/714 |
| 5,214,440 A * | 5/1993 | Takahashi | .............. | H01Q 1/103 343/715 |
| 5,218,375 A * | 6/1993 | Hillman | ................ | E04H 12/182 343/883 |
| 5,243,355 A * | 9/1993 | Emmert | ................. | H01Q 1/244 343/702 |
| 5,414,436 A * | 5/1995 | Shinkawa | .............. | H01Q 1/103 343/715 |
| 5,570,103 A * | 10/1996 | Tetsuka | .................. | H01Q 1/103 343/903 |
| 5,611,176 A * | 3/1997 | Juengert | ................ | A41G 1/001 428/18 |
| 5,714,958 A * | 2/1998 | Rudisill | ................. | H01Q 1/103 343/702 |
| 5,748,150 A * | 5/1998 | Rudisill | ................... | H01Q 1/08 343/702 |
| 5,787,649 A * | 8/1998 | Popowych | .............. | E04H 12/08 52/40 |
| 5,859,622 A * | 1/1999 | Phillips | ................. | H01Q 1/103 343/702 |
| 5,890,520 A * | 4/1999 | Johnson, Jr. | ........... | B67D 7/067 141/94 |
| 6,131,349 A * | 10/2000 | Hill | ........................... | E04H 5/02 343/890 |
| 6,222,503 B1 * | 4/2001 | Gietema | ............. | H01Q 1/1207 343/700 MS |
| 6,326,933 B1 * | 12/2001 | Patachi | .................. | H01Q 1/244 343/901 |
| 6,343,440 B1 * | 2/2002 | Ayers | .................... | H01Q 1/1242 52/40 |
| 6,446,408 B1 * | 9/2002 | Gordin | ................. | E04H 12/182 52/632 |
| 6,694,698 B2 * | 2/2004 | Ryan | ........................ | E04C 3/30 52/741.1 |
| 7,372,428 B1 * | 5/2008 | King | ........................ | H01Q 3/08 343/840 |
| 2004/0080461 A1 * | 4/2004 | Rothgeb | .................. | H01Q 1/424 343/720 |
| 2005/0045224 A1 * | 3/2005 | Lyden | .................... | H02J 7/355 136/252 |
| 2005/0185398 A1 * | 8/2005 | Scannell, Jr. | ............ | A01G 9/02 362/227 |
| 2006/0033674 A1 * | 2/2006 | Essig, Jr. | ................ | B01D 61/06 343/912 |
| 2007/0095551 A1 * | 5/2007 | Watson, III | .......... | H01Q 21/005 174/2 |
| 2008/0012784 A1 * | 1/2008 | Renfro | ................... | H01Q 1/1242 343/890 |
| 2009/0073694 A1 * | 3/2009 | Scannell, Jr. | ............ | A47G 7/06 362/253 |

* cited by examiner

WIRELESS EQUIPMENT CONCEALMENT SYSTEM UTILIZING AN AERIAL MULTIMEDIA PLATFORM

PRIORITY

This application is a continuation of U.S. application Ser. No. 15/583,964 filed May 1, 2017, now U.S. Pat. No. 10,321,591, which is a continuation-in-part application of Patent Cooperation Treaty application no. PCT/US2014/066421 filed Nov. 19, 2014, which claims the priority benefit of U.S. Provisional 62/072,303 filed Oct. 29, 2014, now expired, which are hereby incorporated by reference as if submitted in their entireties.

FIELD OF THE INVENTION

The present invention relates generally to wireless communication equipment casing. More specifically, the present invention is a wireless communication equipment casing that facilitates the accessibility to housed wireless communication equipment and the interchangeability of large sets of wireless communication equipment.

BACKGROUND OF THE INVENTION

The deployment of telecommunication equipment is continually increasing, and the concealment of mobile and fixed wireless devices is becoming increasingly difficult. Telecommunication devices however are a necessity as the devices generate widespread consumer need to send and receive large amounts of voice and data communication. Consequently, telecommunication carriers are continuously upgrading and installing new cellular transmission antenna sites. In order to select ideal antenna sites for the construction of high-rise antenna towers, telecommunication carriers must consult with local municipalities. The aesthetics of large antenna towers have become a difficult issue between telecommunication carriers and local municipalities given that antennas must be placed in locations close to the users of the corresponding data-demanding devices.

It is therefore an objective of the present invention to both effectively conceal antenna towers and maintain unencumbered transmission of radio signals. The present invention provides a multi-function solution that allows for the installation of antenna structures directly within population centers. The present invention is installable at new cellular transmission sites or in place of existing light poles and utility poles. In the preferred embodiment of the present invention, the data of the concealed communications equipment is routed underground where additional equipment is hidden while still able to transmit and receive data. Furthermore, the preferred embodiment of the present invention comprises environmentally friendly materials so that no chemicals will leach into the soil from the installation of the present invention.

DETAILED DESCRIPTION OF THE INVENTION

All illustrations of the drawings are for the purpose of describing selected versions of the present invention and are not intended to limit the scope of the present invention.

Figure 1:
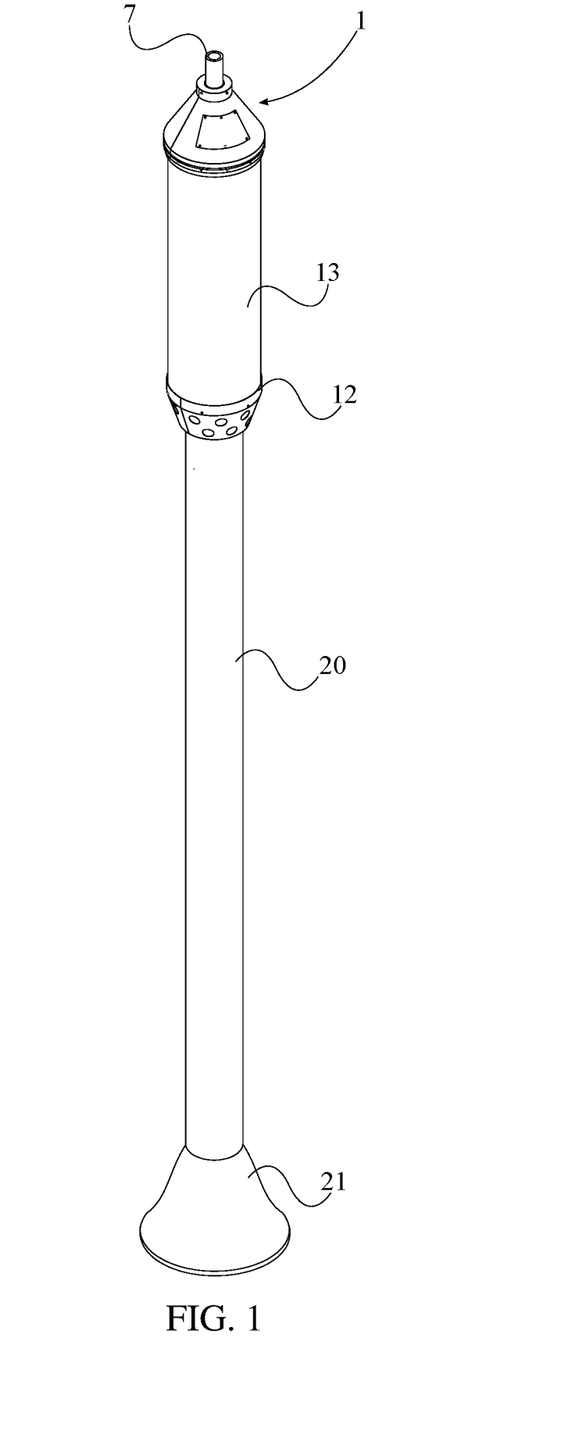
FIG. 1 is a perspective view of the present invention in a closed configuration.
Figure 3:
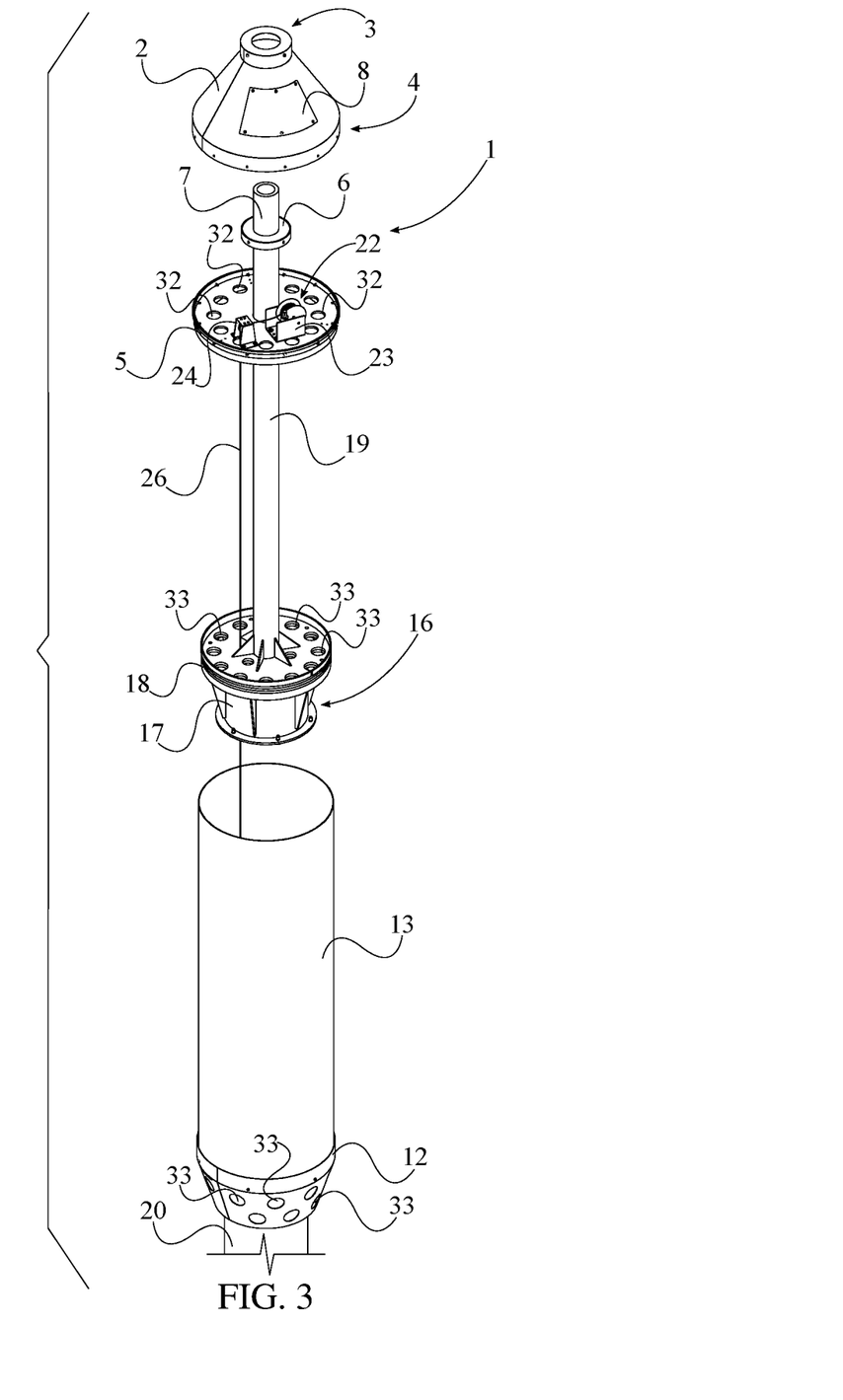
FIG. 3 is an exploded view of the upper capsule, the lower shroud, the tubular housing, the stopper, the mounting pole, and the support post of the present invention.
Figure 7:
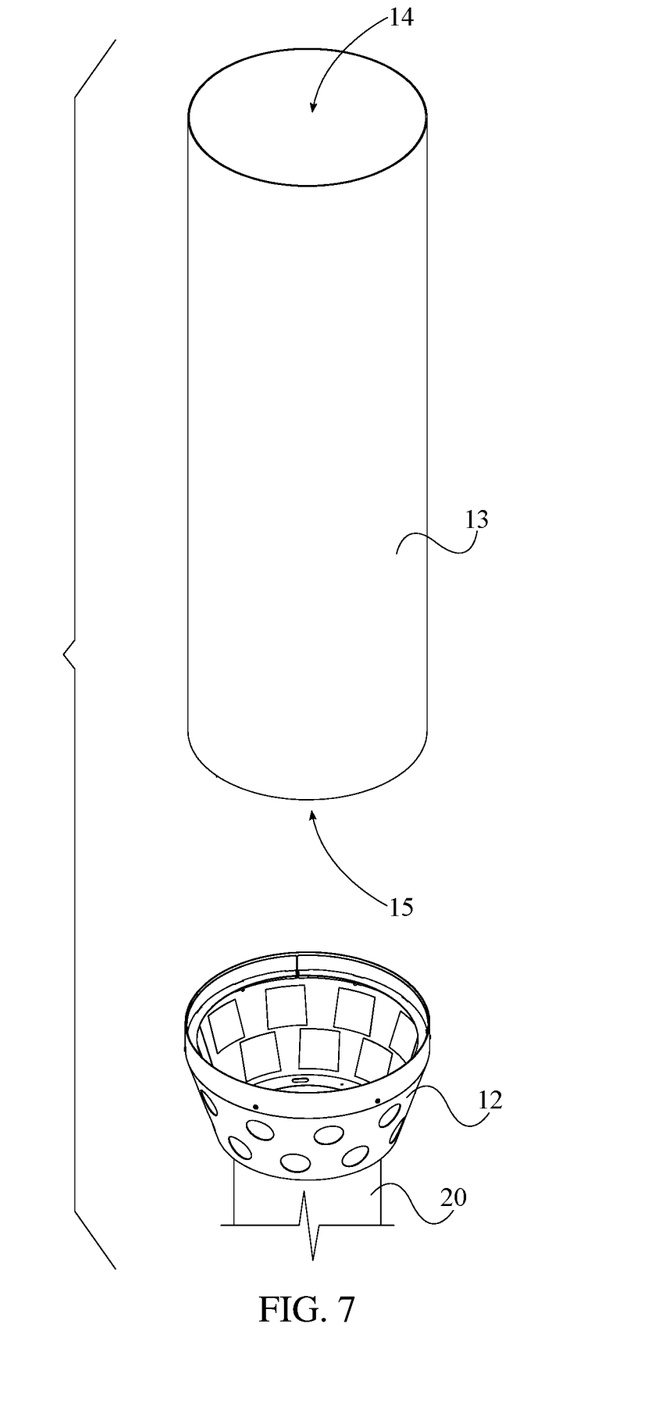
FIG. 7 is an exploded view tubular housing and the lower shroud of the present invention.

The present invention houses and protects vital wireless communication equipment, while permitting the unfettered transmission of radio signals. Wireless communication equipment no longer need to be mounted to existing streetlights, thereby preventing the unwanted visibility of the wireless communication equipment of nearby individuals. As shown in FIG. 1 and FIG. 3, the present invention comprises an upper capsule 1, a lower shroud 12, a tubular housing 13, a stopper 16, a mounting pole 19, a support post 20, and a pulley assembly 22. The upper capsule 1 houses a pulley assembly 22 and covers the tubular housing 13. The upper capsule 1 houses a microwave element that facilitates the backhaul of radio frequency (RF) data traffic. The microwave element housed within the upper capsule 1 is dependent on the data requirement of nearby users, preferably backhaul data requirements. The lower shroud 12 upholds the tubular housing 13. Both the upper capsule 1 and the lower shroud 12 provide ventilation to the wireless communication equipment concealed within the tubular housing 13. The tubular housing 13 conceals, houses, and protects wireless communication equipment from the surrounding environment of the present invention. The stopper 16 upholds the mounting pole 19 and wireless communication equipment and mounts the mounting pole 19 onto the support post 20. The mounting pole 19 serves as a platform to mount a variety of wireless communication equipment. The support post 20 elevates the mounted wireless communication equipment from the ground in order to maintain the signal transmission between the wireless communication equipment and the corresponding devices. The pulley assembly 22 lowers and raises the tubular housing 13 and the lower shroud 12 so that the wireless communication equipment within the tubular housing 13 is accessible for repair of replacement. In order for the tubular housing 13 to be both raised and lowered and allow the wireless communication equipment to be accessible, the tubular housing 13 comprises a first open end 14 and a second open end 15, as shown in FIG. 7. More specifically, the first open end 14 allows the wireless communication equipment to be accessible and the second open end 15 allows the tubular housing 13 to be raised and lowered along the support post 28.

The overall configuration of the aforementioned components allows for the concealment of wireless communication equipment while still maintaining easy accessibility of the wireless communication equipment. The support post 20 and the mounting pole 19 are positioned collinear to each other, which provides the overall structure for the present invention, as shown in FIG. 3. The stopper 16 is connected in between the support post 20 and the mounting pole 19 so that the mounting pole 19 does not slip into or fall off of the support post 20. In order to cover and protect the wireless communication equipment within the tubular housing 13, the upper capsule 1 is terminally mounted onto the mounting pole 19, opposite to the stopper 16, and is concentrically positioned around the support post 20. More specifically, the first open end 14 is oriented towards the upper capsule 1, and the lower shroud 12 is connected adjacent to the second open end 15. The lower shroud 12 is slidably mounted along the support post 20, consequently allowing the tubular housing 13 slide and both expose and conceal the wireless communication equipment mounted onto the mounting pole 19. The lower shroud 12 is able to securely slide about the support post 20 as the upper capsule 1 is tethered to the lower shroud 12 by the pulley assembly 22.

Figure 4:
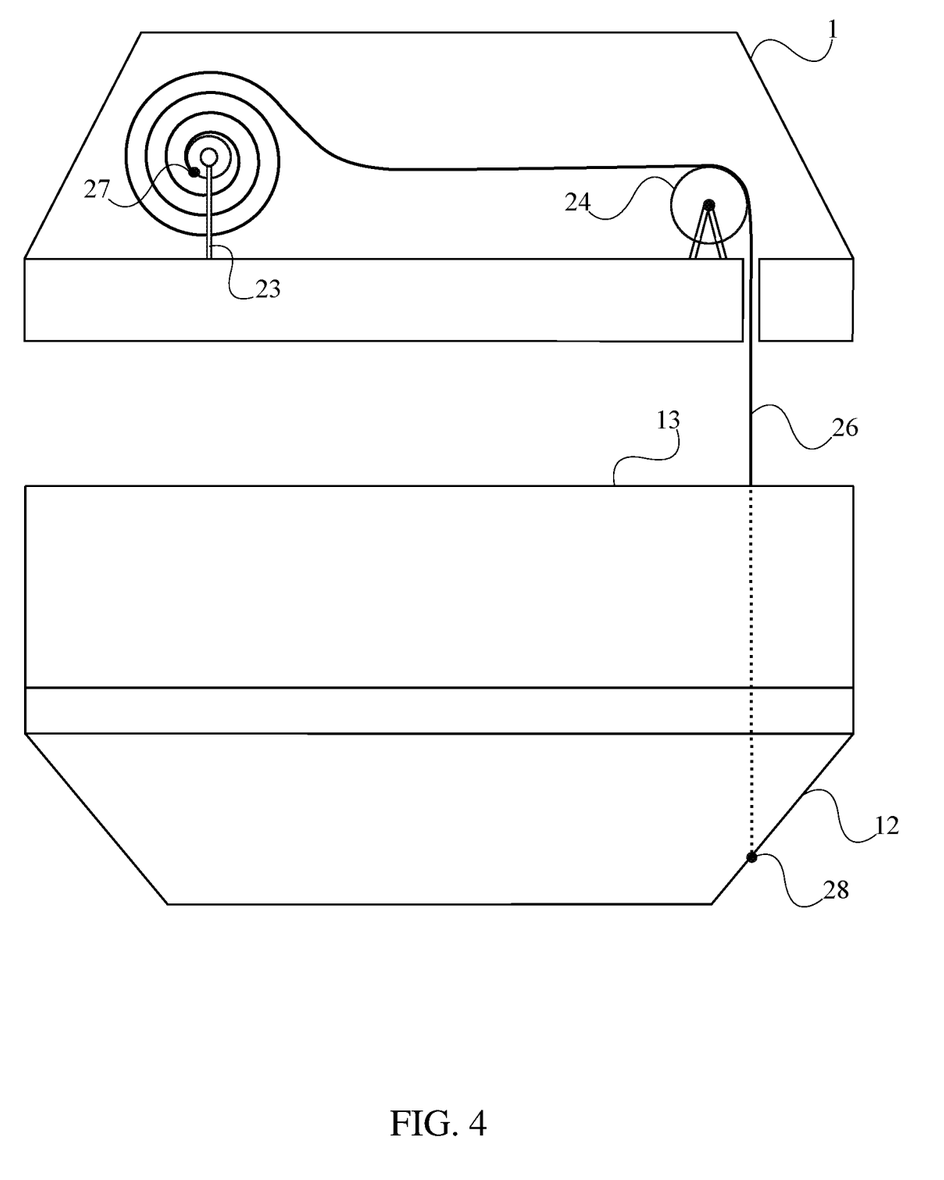
FIG. 4 is a schematic view of the upper capsule, the pulley assembly, and the lower shroud of the present invention.
Figure 6:
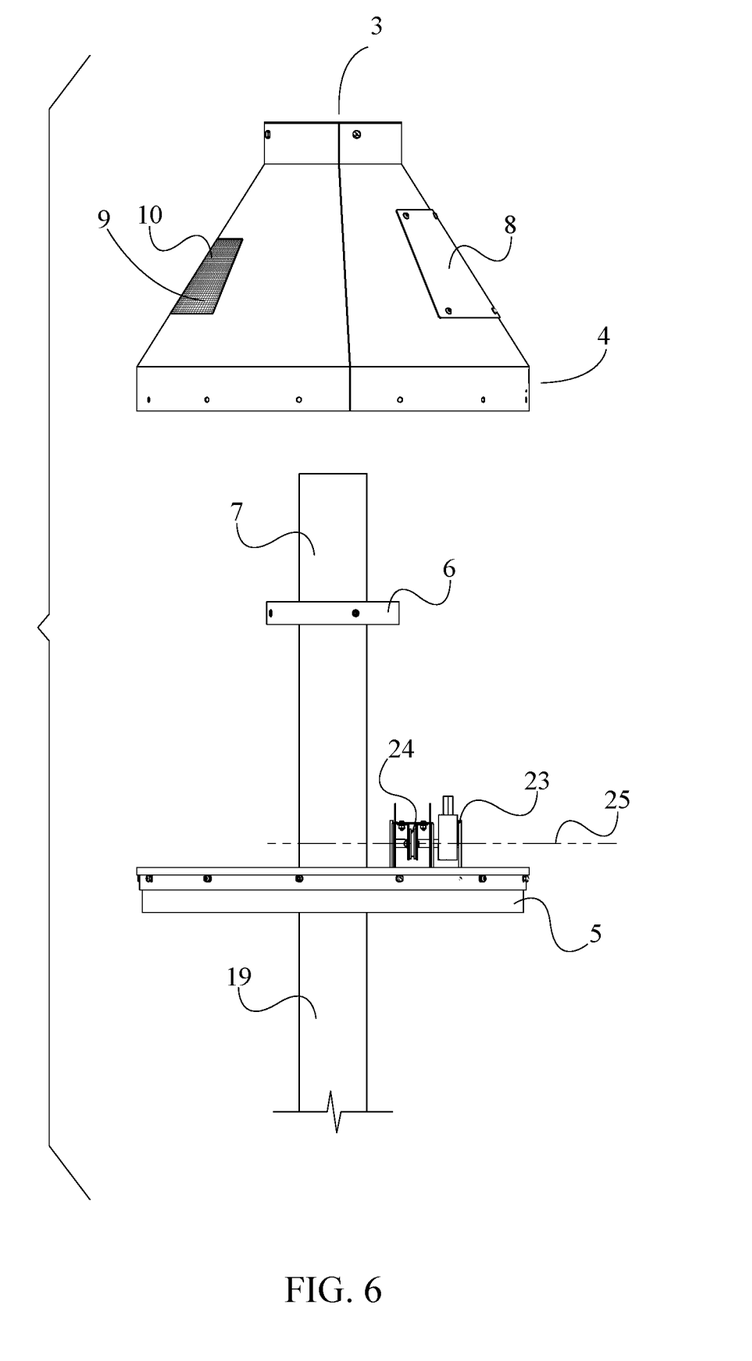
FIG. 6 is an exploded view of the upper shroud and the pulley assembly of the present invention.

In order for the pulley assembly 22 to safely raise and lower both the lower shroud 12 and the tubular housing 13, the pulley assembly 22 comprises a winch 23, a pulley 24, and a cable 26, as illustrated in FIG. 4. The winch 23 allows an individual to control the direction of movement of the lower shroud 12 about the support post 20. The pulley 24 guides the movement and the position of the cable 26. The cable 26 directly connects the upper capsule 1 to the lower shroud 12. The winch 23 and the pulley 24 are mounted within the upper capsule 1 as the upper capsule 1 remains stationary and the lower shroud 12 is slideable. The winch 23 and the pulley 24 are also positioned offset from each other to accommodate the sliding of the cable 26. As illustrated in FIG. 6, rotation axis 25 of the pulley 24 is oriented perpendicular to the mounting pole 19 as the cable 26 slides vertically into and out of the tubular housing 13. More specifically, the cable 26 is both tensionably engaged by the pulley 24 and traverses out of the upper capsule 1. In order to tether the upper capsule 1 to the lower shroud 12, a first end 27 of the cable 26 is fixed to the winch 23 and a second end 28 of the cable 26 is fixed to the lower shroud 12.

In order for the upper capsule 1 to be effectively mounted onto the mounting pole 19, the upper capsule 1 comprises a lateral wall 2, a base plate 5, a collar 6, and a support pole 7, as shown in FIG. 6. The lateral wall 2 surrounds the pulley assembly 22 and the microwave element. The lateral wall 2 comprises an apex end 3 and a base end 4 so as to deflect and precipitation, wind, and a variety of other environmental factors. In the preferred embodiment of the present invention, the lateral wall 2 is a truncated conical shape. The base plate 5 upholds the lateral wall 2, the pulley assembly 22, and the microwave element. The collar 6 provides a platform for which the lateral wall 2 may rest and covers the pulley assembly 22 and microwave element within the upper capsule 1. The support pole 7 positions the upper capsule 1 about the mounting pole 19. The support pole 7 is connected adjacent to the mounting pole 19 and is positioned collinear with the mounting pole 19 in order to structurally reinforce the upper capsule 1 onto the mounting pole 19. The base plate 5 is laterally connected around the support pole 7, adjacent to the mounting pole 19, and the collar 6 is laterally connected around the support pole 7, offset from the base plate 5. This arrangement encloses the upper capsule 1 and the components surrounded by the lateral wall 2. More specifically, the base end 4 is peripherally connected to the base plate 5 and the collar 6 is engaged by the apex end 3, which secures the positioning of the upper capsule 1 along the present invention.

Figure 5:
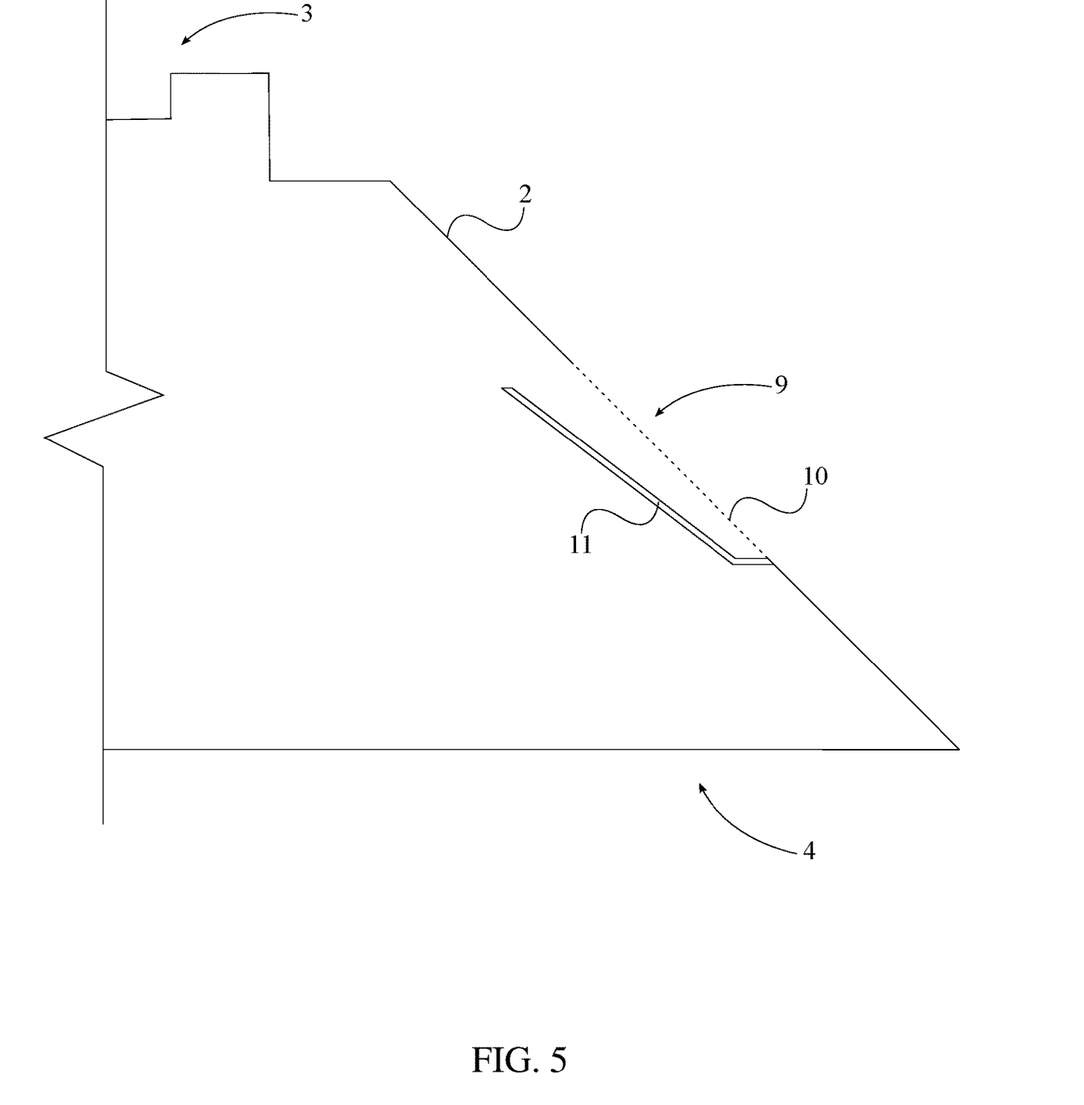
FIG. 5 is a schematic view of the ventilation hole, the air permeable cover, and the trough of the upper capsule for the present invention.

The pulley assembly 22 and the microwave element is accessible within the upper capsule 1 as the upper capsule 1 further comprises an access hatch 8. The access hatch 8 is operatively integrated into the lateral wall 2, wherein the access hatch 8 is used to access an interior of the upper capsule 1. The interior of the upper capsule 1 is sufficiently ventilated as the upper capsule 1 preferably comprises a ventilation hole 9 and an air-permeable cover 10. The ventilation hole 9 facilitates the movement of air into and out of the upper capsule 1. The air 1 permeable cover 10 limits any precipitation from entering the upper capsule 1. In order to encourage airflow within the upper capsule 1, the ventilation hole 9 traverses through the lateral wall 2. The air-permeable cover 10 is positioned onto the ventilation hole 9 and is perimetrically connected to the lateral wall 2 as to defer precipitation from entering into the upper capsule 1. In the event, precipitation passes through the air-permeable cover 10, the upper capsule 1 may further comprise a trough 11, as shown in FIG. 5. The trough 11 collects any excess precipitation that may enter through the air-permeable cover 10. The trough 11 is mounted within the lateral wall 2, adjacent to the ventilation hole 9, so that the trough 11 is able to immediately retain any liquid that leaks through the ventilation hole 9.

Figure 11:
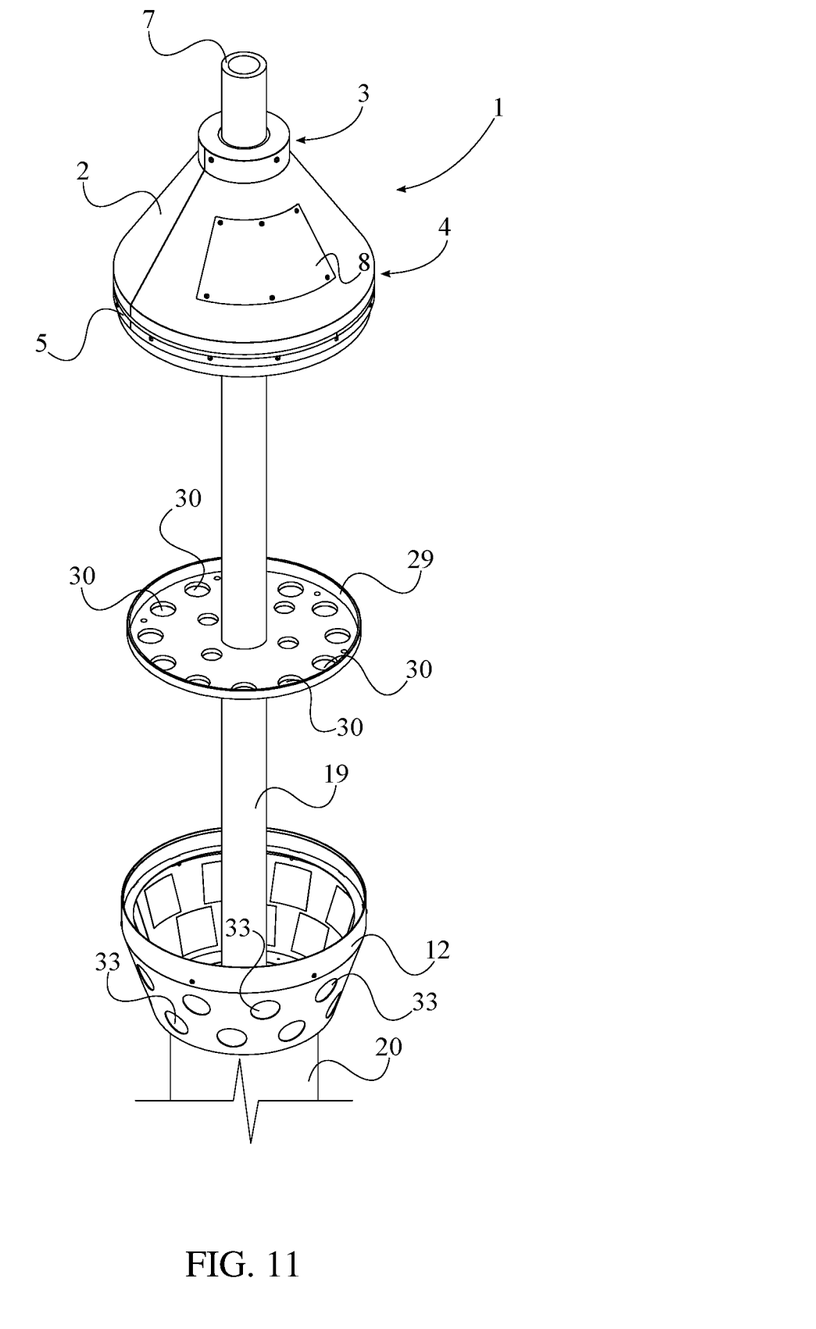
FIG. 11 is a perspective view of the present invention, wherein the mounting pole and at least one divider plate is exposed without the tubular housing.

The wireless communication equipment mounted within the tubular housing 13 may be organized by at least one divider plate 29, shown in FIG. 11. The at least one divider plate 29 separates the tubular housing 13 into at least two sections and provides more mounting surfaces for wireless communication equipment. The at least one divider plate 29 is laterally connected around the mounting pole 19. In the preferred embodiment of the present invention, a plurality of ventilation holes 30 traverses through the at least one divider plate 29. The plurality of ventilation holes 30 encourages airflow through each section of the tubular housing 13.

The upper capsule 1, the mounting pole 19, and the wireless communication equipment mounted onto the mounting pole 19 are effectively supported by the stopper 16 as the stopper 16 comprises an annular body 17 and a retention plate 18, illustrated in FIG. 3. The annular body 17 positions the retention plate 18 about the support post 20 as the annular body 17 is terminally connected around the support post 20. The retention plate 18 serves as a platform for the mounting pole 19 as the retention plate 18 is centrally positioned and adjacent to the mounting pole 19. The annular body 17 is peripherally connected to the retention plate 18 so that the support post 20 may be inserted into the annular body 17 and the stopper 16 is secured onto the support post 20.

Figure 8:
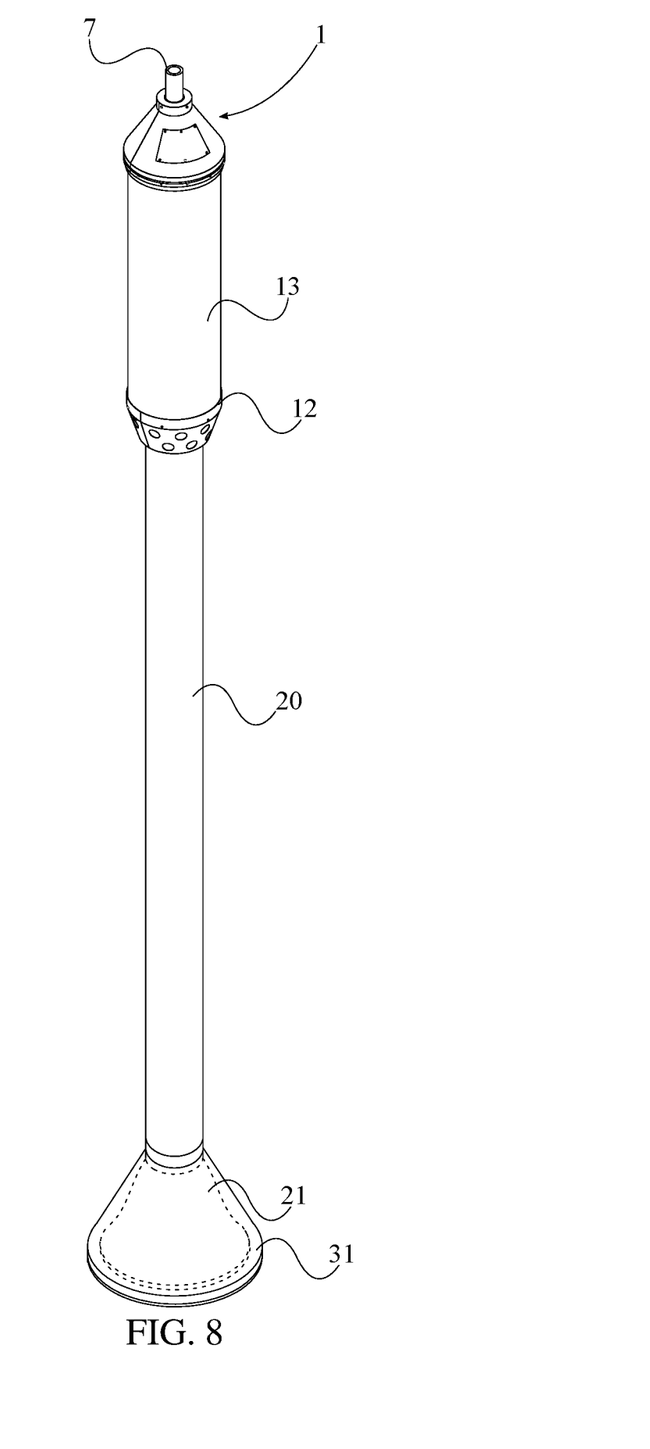
FIG. 8 is a perspective view of the present invention in a closed configuration, wherein the waterproof shroud is connected to the annular base.
Figure 10:
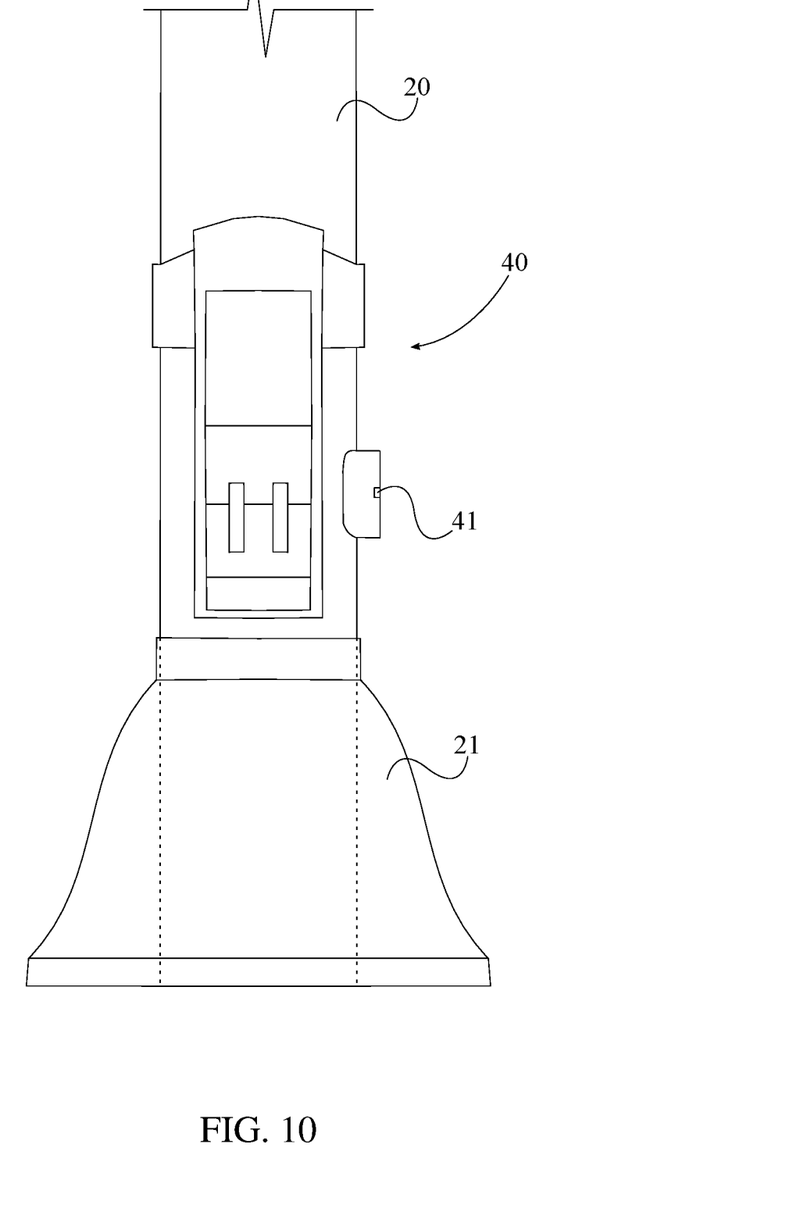
FIG. 10 is a front side view of the waterproof shroud of an embodiment of the present invention.
Figure 12:
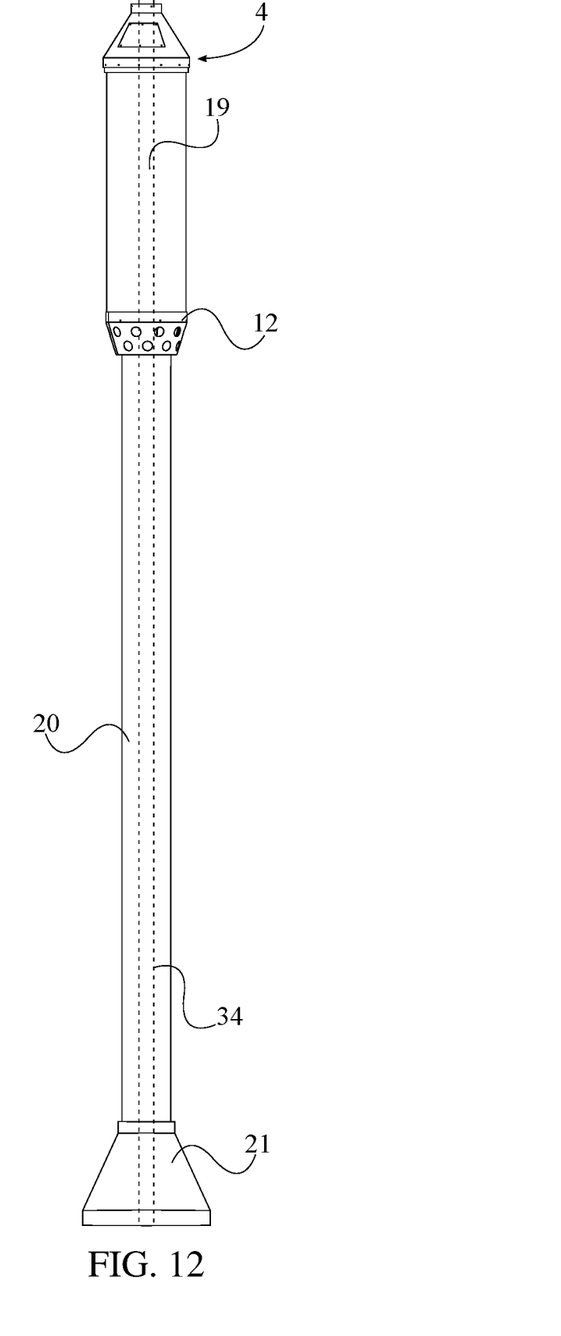
FIG. 12 is a front side view of the present invention in a closed configuration, wherein the wiring conduit traverses through the upper capsule, the mounting pole, and the support post.

In order for the support post 20 to be securely mounted into the ground, the support post 20 comprises an annular base 21, illustrated in FIG. 10. The annular base 21 reinforces the vertical alignment of the support post 20 with respect to the ground. The annular base 21 and the stopper 16 are positioned opposite to each other along the support post 20, as the stopper 16 upholds the mounting pole 19 above the ground. In order to effectively balance support post 20 and all the components above the support post 20, the annular base 21 is laterally connected around the support post 20. In the preferred embodiment of the present invention, a waterproof shroud 31 further protects the electrical connections and electrical devices housed within the ground beneath the present invention, as shown in FIG. 8. Consequently, the waterproof shroud 31 laterally connects around the annular base 21 as electrical connections from the wireless communication equipment extend into the ground and connect to a variety of electronic devices. Any additional electronic devices which may include power sources may be housed within a vault underground or a vault mounted on the ground adjacent to the support post 20. In the preferred embodiment of the present invention, a wiring conduit 34 positions and organizes the electrical connections between the wireless communication device and electronic devices. The wiring conduit 34 traverses through the upper capsule 1, the mounting pole 19, the stopper 16, and the support post 20, as shown in FIG. 12.

The wireless communication equipment and electrical connections housed within the present invention must not only be protected from the surrounding environment, but must also be properly maintained while housed within the present invention. As shown in FIG. 3, a first set of vents 32 and a second set of vents 33 ensure the proper ventilation and airflow within the upper capsule 1, the tubular housing 13, and the lower shroud 12. The first set of vents 32 traverses out of the tubular housing 13 and into the upper capsule 1. The second set of vents 33 traverses out of the tubular housing 13, through the stopper 16, and through the lower shroud 12. In an embodiment of the present invention, the first set of vents 32 and the second set of vents 33 may be covered with air-permeable covers as that of the ventilation hole 9 of the upper capsule 1. The arrangement of the first set of vents 32, the second set of vents 33, and the ventilation hole 9 of the upper capsule 1 maximizes the airflow within the present invention.

Figure 2:
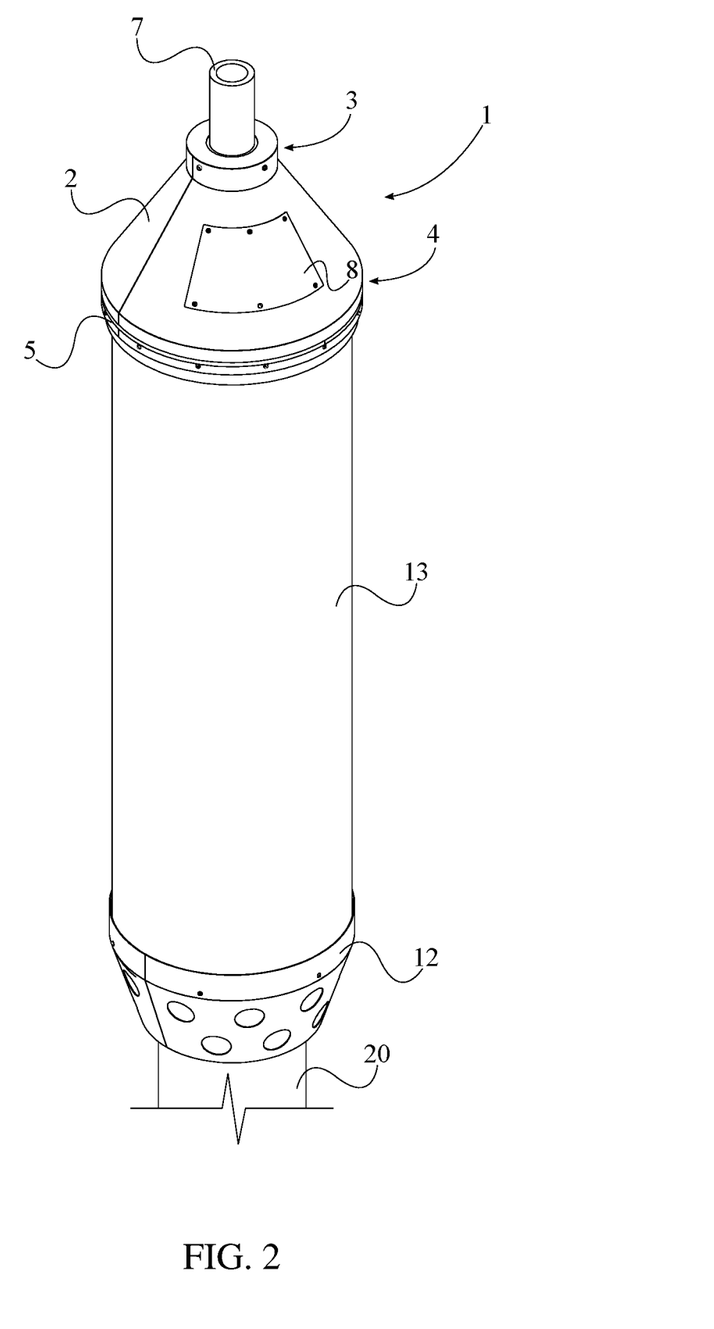
FIG. 2 is a perspective view of the upper capsule, the lower shroud, the tubular housing, and the support post of the present invention.

The present invention allows for the quick and easy access of the wireless communication equipment and the replacement of sets of communication equipment. When the upper capsule 1, the tubular housing 13, and the lower shroud 12 are in a closed configuration, as shown in FIG. 2, the tubular housing 13 is positioned against the upper capsule 1, and the lower shroud 12 is attached around the stopper 16. In the closed configuration, the wireless communication equipment within the tubular housing 13 is sealed and protected from surrounding environmental conditions. In order to access the wireless communication within the tubular housing 13, the lower shroud 12 is unfastened from the stopper 16, and the winch is engaged until the mounting pole 19 and the wireless communication equipment is exposed. When the upper capsule 1, the tubular housing 13, and the lower shroud 12 are in an open configuration, the tubular housing 13 is positioned offset from the upper capsule 1, and the lower shroud 12 is positioned offset from the stopper 16. The stopper 16 and the lower shroud 12 may be separated from the support post 20 while the upper capsule 1, the mounting pole 19, and the tubular housing 13 remain connected in the event all the wireless communication devices that are mounted onto the mounting pole 19 must be replaced. An upper capsule 1, a lower shroud 12, a tubular housing 13, a stopper 16, and a mounting pole 19 that house a new set of wireless communication devices may then be connected to the support post 20.

Figure 9:
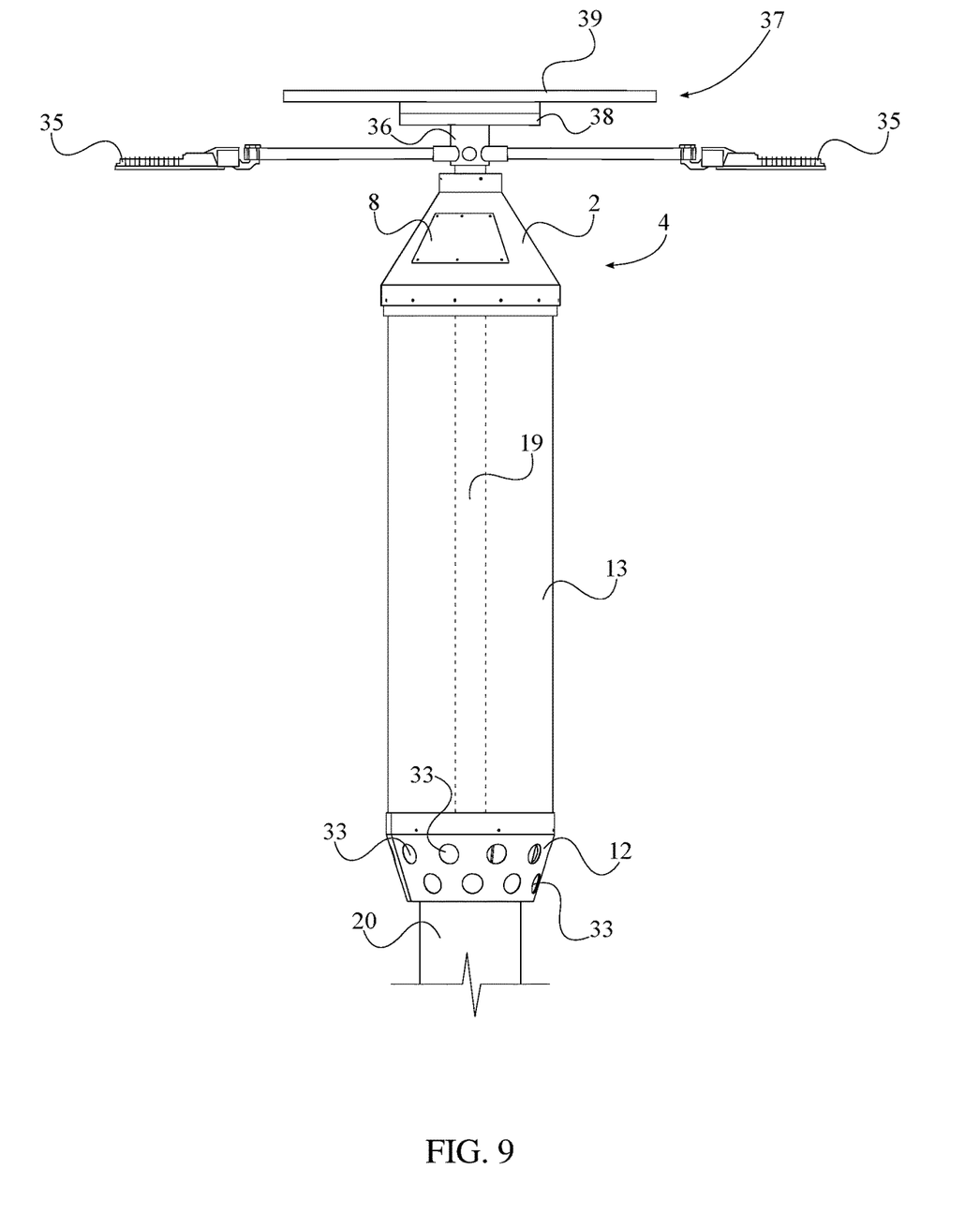
FIG. 9 is a front side view of the plurality of elongated lamps, the support hub, and the solar panel assembly in an embodiment of the present invention.

An alternate embodiment of the present invention comprises a plurality of elongated lamps 35 and a support hub 36, shown in FIG. 9. The plurality of elongated lamps 35 illuminates the surrounding area about the present invention. The support hub 36 connects the plurality of elongated lamps 35 onto the upper capsule 1. More specifically, the support hub 36 is mounted adjacent to the upper capsule 1, opposite to the mounting pole 19. In order to effectively maximize the illumination of the plurality of elongated lamps 35, the plurality of elongated lamps 35 is radially mounted around the support hub 36.

An alternate embodiment of the present invention comprises a solar panel assembly 37 in order to provide wireless communication equipment with additional power, as shown in FIG. 9. The solar panel assembly 37 comprises a support bracket 38 and at least one solar panel 39. The support bracket 38 upholds the at least one solar panel 39, and the at least one solar panel 39 captures sunlight and delivers the necessary power converted from the sunlight to the wireless communication equipment. The at least one solar panel 39 is positioned adjacent to the upper capsule 1, opposite to the mounting pole 19, so that the at least one solar panel 39 is not blocked from direct sunlight. More specifically, the at least one solar panel 39 is mounted onto the upper capsule 1 by the support bracket 38 so that the at least one solar panel 39 is secure.

An alternate embodiment of the present invention comprises an electric-vehicle charging module 40 as to provide power to connected electric vehicles, as shown in FIG. 10. The electric-vehicle charging module 40 comprises at least one outlet 41. The at least one outlet 41 allows an electric vehicle to be plugged into the electric-vehicle charging module 40 and harness the necessary power. The electric-vehicle charging module 40 is positioned along the support post 20, offset from the stopper 16, and is laterally integrated into the support post 20 so that drivers of electric cars may reach the at least one outlet 41.

Although the invention has been explained in relation to its preferred embodiment, it is to be understood that many other possible modifications and variations can be made without departing from the spirit and scope of the invention as hereinafter claimed.

What is claimed is:
1. A wireless communication equipment casing comprising:
    an upper capsule;
    a lower shroud;
    a housing comprising a first end and a second end;
    a mounting pole;
    a support post positioned collinear with the mounting pole;
    a stopper connected between the mounting pole and the support post; and
    a pulley assembly;
    wherein the upper capsule is terminally mounted onto the mounting pole, opposite the stopper;
    wherein the housing is positioned around the support post;
    wherein the first end is oriented towards the upper capsule;
    wherein the lower shroud is connected adjacent to the second end;
    wherein the lower shroud is slidably mounted along the support post; and
    wherein the upper capsule is tethered to the lower shroud by the pulley assembly.
2. The wireless communication equipment casing as claimed in claim 1, wherein the pulley assembly comprises:
    a winch, a pulley, and a cable;

wherein the winch and the pulley are mounted within the upper capsule, the winch and the pulley are positioned offset from each other;

wherein a rotation axis of the pulley is oriented perpendicular to the mounting pole;

wherein a first end of the cable is fixed to the winch;

wherein a second end of the cable is fixed to the lower shroud;

wherein the cable is tensionably engaged by the pulley; and wherein the cable traverses out of the upper capsule.

3. The wireless communication equipment casing as claimed in claim 1, wherein the upper capsule comprises:

a lateral wall, a base plate, a collar, and a support pole;

wherein the lateral wall comprises an apex end and a base end;

wherein the lateral wall is a truncated conical shape;

wherein the support pole is connected adjacent to the mounting pole;

wherein the support pole is positioned collinear with the mounting pole;

wherein the base plate is laterally connected around the support pole, adjacent to the mounting pole;

wherein the collar is laterally connected around the support pole, offset from the base plate;

wherein the base end is peripherally connected to the base plate; and wherein the collar is engaged by the apex end.

4. The wireless communication equipment casing as claimed in claim 1 wherein the upper capsule comprises;

a lateral wall and an access hatch;

wherein the lateral wall is a truncated conical shape;

wherein the access hatch is operatively integrated into the lateral wall; and wherein the access hatch provides access to an interior of the upper capsule.

5. The wireless communication equipment casing as claimed in claim 1 wherein the upper capsule comprises:

a lateral wall, a ventilation hole, and an air-permeable cover;

wherein the ventilation hole traverses through the lateral wall;

wherein the air-permeable cover is positioned onto the ventilation hole; and wherein the air-permeable cover is perimetrically connected to the lateral wall.

6. The wireless communication equipment casing as claimed in claim 4 comprises:

wherein the upper capsule further comprises a trough; and wherein the trough is mounted within the lateral wall, adjacent to the ventilation hole.

7. The wireless communication equipment casing as claimed in claim 1 comprises:

at least one divider plate;

wherein the at least one divider plate is laterally connected around the mounting pole.

8. The wireless communication equipment casing as claimed in claim 7 comprises:

a plurality of ventilation holes;

wherein the plurality of ventilation holes traverse through the at least one divider plate.

9. The wireless communication equipment casing as claimed in claim 1 comprises:

wherein the stopper comprises an annular body and a retention plate, the annular body is terminally connected around the support post, the retention plate is centrally and adjacent to the mounting pole, and the annular body is peripherally connected to the retention plate.

10. The wireless communication equipment casing as claimed in claim 1 comprises:

wherein the support post comprises an annular base, the annular base and the stopper are positioned opposite to each other along the support post, and the annular base is laterally connected around the support post.

11. The wireless communication equipment easing as claimed in claim 10 comprises:

a waterproof shroud;

wherein the waterproof shroud is laterally connected around the annular base.

12. The wireless communication equipment casing as claimed in claim 1 comprises:

a first set of vents;

wherein the first set of vents traverse out of the tubular housing and into the upper capsule.

13. The wireless communication equipment casing as claimed in claim 1 comprises:

a second set of vents;

wherein the second set of vents traverses out of the tubular housing, through the stopper, and through the lower shroud.

14. The wireless communication equipment casing as claimed in claim 1 comprises:

a wiring conduit;

wherein the wiring conduit traverses through the upper capsule, the mounting pole, the stopper, and the support post.

15. The wireless communication equipment casing as claimed in claim 1 comprises:

wherein the upper capsule, the tubular housing, and the lower shroud are in a closed configuration, the tubular housing is positioned against the upper capsule, and the lower shroud is attached around the stopper.

16. The wireless communication equipment casing as claimed in claim 1 comprises:

wherein the upper capsule, the tubular housing, and the lower shroud are in an open configuration, the tubular housing is positioned offset from the upper capsule; and the lower shroud is positioned offset from the stopper.

17. The wireless communication equipment casing as claimed in claim 1 comprises:

a plurality of elongated lamps;

a support hub;

wherein the support hub being mounted adjacent to the upper capsule, opposite to the mounting pole and the plurality of elongated lamps are radially mounted around the support hub.

18. The wireless communication equipment casing as claimed in claim 1 comprises:

a solar panel assembly;

wherein the solar panel assembly comprises a support bracket and at least one solar panel;

wherein the at least one solar panel is positioned adjacent to the upper capsule, opposite to the mounting pole, and the at least one solar panel is mounted onto the upper capsule by the support bracket.

19. The wireless communication equipment casing as claimed in claim 1 comprises:

an electric-vehicle charging module;

wherein the electric-vehicle charging module comprises at least one outlet, is positioned along the support post, offset from the stopper, and is laterally integrated into the support post.

* * * * *